(12) United States Patent
Liu et al.

(10) Patent No.: US 7,300,601 B2
(45) Date of Patent: Nov. 27, 2007

(54) PASSIVATIVE CHEMICAL MECHANICAL POLISHING COMPOSITION FOR COPPER FILM PLANARIZATION

(75) Inventors: Jun Liu, Brookfield, CT (US); Peter Wrschka, Danbury, CT (US); David Bernhard, Kooskia, ID (US); MacKenzie King, Southbury, CT (US); Michael Darsillo, Woodbury, CT (US); Karl Boggs, Hopewell Junction, NY (US)

(73) Assignee: Advanced Technology Materials, Inc., Danbury, CT (US)

( * ) Notice: Subject to any disclaimer, the term of this patent is extended or adjusted under 35 U.S.C. 154(b) by 420 days.

(21) Appl. No.: 10/315,641

(22) Filed: Dec. 10, 2002

(65) Prior Publication Data

US 2004/0108302 A1 Jun. 10, 2004

(51) Int. Cl.
C09K 13/00 (2006.01)
C09K 13/04 (2006.01)
C09K 13/06 (2006.01)
H01L 21/302 (2006.01)

(52) U.S. Cl. .................. 252/79.1; 252/79.2; 252/79.4; 438/692

(58) Field of Classification Search .............. 252/79.1, 252/79.2, 79.4; 438/692
See application file for complete search history.

(56) References Cited

U.S. PATENT DOCUMENTS 6,184,141 B1    2/2001    Avanzino et al.
6,190,237 B1 *  2/2001    Huynh et al. .................. 451/41
6,312,486 B1 * 11/2001    Sandhu et al. ................. 51/307
6,428,721 B1 *  8/2002    Ina et al. ..................... 252/79.4
6,429,134 B1    8/2002    Kubota et al.
6,440,186 B1 *  8/2002    Sakai et al. ................... 51/308
6,447,695 B1 *  9/2002    Motonari et al. .......... 252/79.1
6,638,854 B2   10/2003    Homma et al.
6,656,842 B2   12/2003    Li et al.
6,805,812 B2   10/2004    Fang
6,936,543 B2    8/2005    Schroeder et al.
2001/0008828 A1 7/2001    Uchikura et al. ............. 216/83

(Continued)

FOREIGN PATENT DOCUMENTS

EP    1 081 200 A1    3/2001

(Continued)

OTHER PUBLICATIONS

U.S. Appl. No. 09/820,749, filed Mar. 30, 2001, Motonari et al.

(Continued)

*Primary Examiner*—Nadine G. Norton
*Assistant Examiner*—Lynette T. Umez-Eronini
(74) *Attorney, Agent, or Firm*—Maggie Chappuis; Tristan A. Fuierer; Moore & Van Allen PLLC

(57) ABSTRACT

A CMP composition containing 5-aminotetrazole, e.g., in combination with oxidizing agent, chelating agent, abrasive and solvent. Such CMP composition advantageously is devoid of BTA, and is useful for polishing surfaces of copper elements on semiconductor substrates, without the occurrence of dishing or other adverse planarization deficiencies in the polished copper, even in the presence of substantial levels of copper ions, e.g., $Cu^{2+}$, in the bulk CMP composition at the copper/CMP composition interface during CMP processing.

79 Claims, 1 Drawing Sheet

U.S. PATENT DOCUMENTS

2002/0005017 A1* 1/2002 Motonari et al. .............. 51/307
2003/0100247 A1 5/2003 Kim et al.

FOREIGN PATENT DOCUMENTS

EP 1 138 733 A2 10/2001
EP 1 138 734 A2 10/2001

OTHER PUBLICATIONS

Hariharaputhiran, et al. Journal of the Electochemical Society, 147 (10) 3820-3826 (2000).
Aksu, et al. Journal of the Electrochemical Society, 149 (6) G352-G361 (2002).
Supplementary European Search Report for EP 03 81 2786 dated Nov. 30, 2005.

* cited by examiner

PASSIVATIVE CHEMICAL MECHANICAL POLISHING COMPOSITION FOR COPPER FILM PLANARIZATION

FIELD OF THE INVENTION

The present invention relates to a chemical mechanical polishing composition and to a method of using same for the polishing of semiconductor substrates having copper thereon, e.g., copper interconnects, electrodes, or metallization, as part of a semiconductor device structure on a wafer substrate.

DESCRIPTION OF THE RELATED ART

Copper is widely employed in semiconductor manufacturing as a material of construction for components of semiconductor device structures on wafer substrates (e.g., contacts, electrodes, conductive vias, field emitter base layers, etc.), and it is rapidly becoming the interconnect metal of choice in semiconductor manufacturing due to its higher conductivity and increased electromigration resistance relative to aluminum and aluminum alloys.

Typically, the process scheme for utilizing copper in semiconductor manufacturing involves the damascene approach, wherein features are etched in a dielectric material. In the dual damascene process a single step is used to form both plugs and lines. Since copper has a propensity to diffuse into the dielectric material, leading to leakage between metal lines, barrier layers, such as Ta or TaN deposited by various deposition methods, are often used to seal the copper interconnects. Following deposition of the barrier layer material, a thin seed layer of copper is deposited on the barrier material via physical vapor deposition, followed by electrodeposition of copper to fill the features. The deposited copper must then be planarized to render it of suitable form to accommodate subsequent process steps in the fabrication of the finished semiconductor product, and in order to satisfactorily operate in the microcircuitry in which it is present. The planarization typically involves chemical mechanical polishing (CMP), using a CMP composition formulated for such purpose.

Due to the difference in chemical reactivity between copper and the (Ta or TaN) barrier layer, two chemically distinct slurries are often used in the copper CMP process. The first step slurry (Step I) is used to rapidly planarize the topography and to uniformly remove the remaining copper, with the polish stopping at the barrier layer. The second step slurry (Step II) removes the barrier layer material at a high removal rate and stops on the dielectric oxide layer, or alternatively on a cap layer that has been applied to protect the oxide.

Step I chemical mechanical polishing (CMP) compositions for planarization and polishing of copper typically are in the form of slurries containing an abrasive of suitable type, e.g., an abrasive selected from among silica, alumina, and other oxides and mineralic materials, in a solvent medium containing one or more solvent species, e.g., water, organic solvents, etc.

One type of CMP composition for planarizing copper surfaces includes an aqueous slurry of abrasive particles, containing hydrogen peroxide as an oxidizing component and glycine as a chelating agent. Glycine has been found to react with solution phase $Cu^{+2}$ ions formed by oxidation of Cu metal to form a $Cu^{2+}$-glycine complex. The complexing of $Cu^{+2}$ ions through formation of a water soluble $Cu^{2+}$-glycine chelate assists in removal of Cu in protruded regions via a direct dissolution mechanism, and the $Cu^{2+}$-glycine complex decomposes hydrogen peroxide to yield hydroxyl radicals having a higher oxidation potential than hydrogen peroxide itself.

In step I CMP slurries containing abrasive particles, hydrogen peroxide and glycine, the compound benzotriazole (BTA) is often used as a corrosion inhibitor. BTA

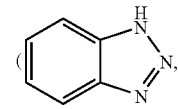

FW: 119.13) complexes with copper to form an insoluble Cu-BTA complex on the copper surface. The resulting insoluble protective film facilitates the planarization of the topography of the device structure being fabricated, since the recessed areas on the wafer surface are protected from dissolution, while mechanical action of the abrasive species on the protruding areas enables material removal and polishing to be carried out. Additionally, the Cu-BTA complex minimizes corrosion and preserves the functional integrity of the copper device structures for their intended use.

BTA functions well as a copper corrosion inhibitor in the absence of OH radicals generated as a result of the $Cu^{2+}$-glycine induced catalytic decomposition of hydrogen peroxide. However, in first step copper CMP slurries containing hydrogen peroxide and glycine, the formation of highly oxidizing OH radicals under dynamic CMP conditions cannot be avoided, since copper metal is readily oxidized in such CMP environment.

Experiments with the addition of $Cu^{2+}$ to an $H_2O_2$/glycine/BTA system have shown that the presence of $Cu^{2+}$ increases the static etch rate of Cu dramatically, and at the same time, the Cu corrosion potential is shifted to less noble ranges.

The significance of this finding is that BTA is not effective in protecting the low features of copper wafer surfaces during the CMP process, and thus allows "dishing" to occur in high-density patterned areas when $Cu^{2+}$ cation is present in the CMP composition.

An alternative to the use of BTA as a corrosion inhibitor in CMP compositions therefore is highly desirable. Specifically, an alternative corrosion inhibitor is desired, which is compatible with $H_2O_2$/glycine-based CMP compositions and effective to passivate copper surfaces when significant amounts of Cu ions are present in bulk solution and/or near the metal/solution interface during CMP processing.

SUMMARY OF THE INVENTION

The present invention relates to CMP compositions containing 5-aminotetrazole (ATA,

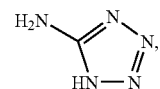

FW: 85.06), and to copper CMP using such compositions.

In one aspect, the invention relates to a CMP composition for planarization of copper films, in which the composition includes oxidizing agent, chelating agent, and corrosion inhibitor, and the corrosion inhibitor includes 5-aminotetrazole.

In a further aspect, the invention relates to a CMP composition for planarization of copper films. The composition comprises an aqueous slurry medium including abrasive, solvent, ATA, $H_2O_2$ and glycine. In the composition, ATA, $H_2O_2$ and glycine have the following concentrations by weight, based on the total weight of the composition:

| | |
|---|---|
| ATA | 0.01–10 wt. % |
| $H_2O_2$ | 1–30 wt. % |
| Glycine | 0.1–25 wt. %. |

Yet another aspect of the invention relates to a CMP composition including the following components by weight, based on the total weight of the composition:

| | |
|---|---|
| ATA | 0.01–10 wt. % |
| $H_2O_2$ | 1–30 wt. % |
| Glycine | 0.1–25 wt. %. |
| Abrasive | 0–30 wt. % |
| Water | 30–90 wt. % | with the total wt. % of all components in the composition totaling to 100 wt. %.

Still another aspect of the invention relates to a method of polishing copper on a substrate having copper thereon, including contacting copper on the substrate under CMP conditions with a CMP composition effective for polishing the copper, wherein the CMP composition includes ATA.

Other aspects, features and embodiments of the invention will be more fully apparent from the ensuing disclosure and appended claims.

DETAILED DESCRIPTION OF THE INVENTION AND PREFERRED EMBODIMENTS THEREOF

Figure 1:
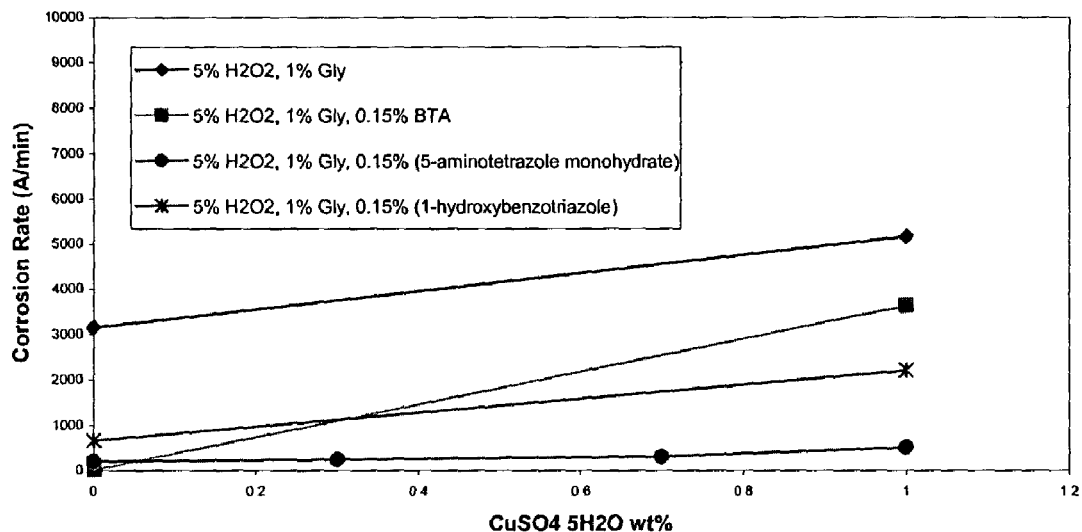
FIG. 1 is a graph of static etch rates of copper metal, in Angstroms per minute, as a function of added copper sulfate ($CuSO_4.5H_2O$) concentration, in a $H_2O_2$/Glycine/$Cu^{2+}$ system at pH 3.5, for (i) 5% $H_2O_2$ and 1% glycine, (ii) 5% $H_2O_2$, 1% glycine, and 0.15% BTA, (iii) 5% $H_2O_2$, 1% glycine, and 0.15% 5-aminotetrazole monohydrate, and (iv) 5% $H_2O_2$, 1% glycine, and 0.15% 1-hydroxybenzotriazole.

The present invention is based on the discovery that 5-aminotetrazole

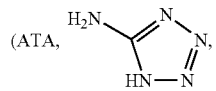

(FW: 85.06) is unexpectedly effective as a replacement for BTA as a copper corrosion inhibitor in CMP compositions for planarizing copper films. ATA is compatible with CMP compositions containing hydrogen peroxide as an oxidizer and glycine as a chelator. The ATA-containing CMP composition achieves active passivation of copper surfaces even when significant amounts of copper ions, e.g., $Cu^{2+}$ cations, are present in bulk solution and/or at the metal/solution interface during CMP processing.

The ATA-containing CMP composition of the invention, in its broad contemplation, can be formulated with any suitable constituents, including any appropriate oxidizing agent(s), chelating agent(s), and corrosion inhibitor(s), abrasive media, solvent media, and optionally any suitable additives, adjuvants, excipients, etc., such as stabilizing agents, acids, bases (e.g., amines), surfactants, buffering agents, etc.

Oxidizing agents employed in the broad practice of the invention can be of any suitable type, including for example ferric nitrate, ferric ammonium oxalate, ferric ammonium citrate, permanganate salts (e.g., potassium permanganate), peroxyacids (e.g. peracetic acid), peroxoborate salts (e.g., potassium peroxoborate), urea-hydrogen peroxide, iodate salts (e.g., potassium iodate), perchlorate salts (e.g. tetramethylammonium perchlorate), persulfate salts, bromate salts, benzoquinone, chlorate salts, chlorite salts, hypochlorite salts, hypoiodite salts, oxybromide salts, percarbonate salts, periodate salts, ceric salts (e.g., ammonium ceric sulfate), chromate and dichromate compounds, cupricyanide and ferricyanide salts, ferriphenanthroline, ferripyridine and ferrocinium. Preferred oxidizers include peracetic acid, urea-hydrogen peroxide, di-t-butyl peroxide, benzyl peroxide, hydrogen peroxide and compatible mixtures including two or more of such oxidizer species.

Chelating agents in the CMP compositions of the invention can be of any appropriate type, including, for example: glycine, serine, proline, leucine, alanine, asparagine, aspartic acid, glutamine, valine, lysine, etc.; polyamine complexes and their salts, including ethylenediaminetetraacetic acid, N-hydroxyethylethylenediaminetriacetic acid, nitrilotriacetic acid, iminodiacetic acid, diethylenetriaminepentaacetic acid, and ethanoldiglycinate; polycarboxylic acids, including phthalic acid, oxalic acid, malic acid, succinic acid, mandelic acid, and mellitic acid; and compatible mixtures including two or more of the foregoing species. Preferred chelating agents include amino acids, with glycine being most preferred.

ATA is employed in CMP compositions of the invention in any suitable concentration. Suitable concentration of ATA in a specific formulation is readily empirically determinable within the skill of the art, based on the disclosure herein, to provide a CMP composition with suitable copper surface passivation characteristics even in CMP environments containing high levels of copper cations. In one preferred embodiment of the invention, the amount of ATA in the CMP composition is in a range of from about 0.01 to about 10% by weight, based on the total weight of the CMP composition, with an amount of ATA in a range of from about 0.05 to about 5% by weight being more preferred, an amount of ATA in a range of from about 0.10 to about 1.0% by weight being even more preferred, and an amount of ATA in a range of from about 0.2 to 0.8% by weight being most preferred, on the same total weight basis, although greater or lesser percentages may be employed to advantage in specific applications within the broad scope of the present invention.

The corrosion inhibitor component in the CMP composition of the invention comprises ATA, and can additionally include other corrosion inhibitor components in combination with ATA, in specific embodiments of the invention. Such other corrosion inhibitor components may be of any suitable type, including for example, imidazole, benzotriazole, benzimidazole, amino, imino, carboxy, mercapto, nitro, alkyl, urea and thiourea compounds and derivatives, etc. Preferred inhibitors include tetrazoles and their derivatives, and the invention therefore contemplates the provision of ATA alone or in combination with other tetrazole (or other corrosion inhibitor) species, as the corrosion inhibitor in compositions according to the present invention.

The abrasive can be of any suitable type, including, without limitation, metal oxides, silicon nitrides, carbides, etc. Specific examples include silica, alumina, silicon carbide, silicon nitride, iron oxide, ceria, zirconium oxide, tin oxide, titanium dioxide, and mixtures of two or more of such components in suitable form, such as grains, granules, particles, or other divided form. Alternatively, the abrasive can include composite particles formed of two or more materials, e.g., NYACOL® alumina-coated colloidal silica (Nyacol Nano Technologies, Inc., Ashland, Mass.). Alumina is a preferred inorganic abrasive and can be employed in the form of boehmite or transitional δ, θ or γ phase alumina. Organic polymer particles, e.g., including thermoset and/or thermoplastic resin(s), can be utilized as abrasives. Useful resins in the broad practice of the present invention include epoxies, urethanes, polyesters, polyamides, polycarbonates, polyolefins, polyvinylchloride, polystyrenes, polyolefins, and (meth)acrylics. Mixtures of two or more organic polymer particles can be used as the abrasive medium, as well as particles comprising both inorganic and organic components.

Bases can be optionally employed for pH adjustment in compositions of the invention. Illustrative bases include, by way of example, potassium hydroxide, ammonium hydroxide and tetramethylammoniumhydroxide (TMAH), tetraethylammonium hydroxide, trimethyl hydroxyethylammonium hydroxide, methyl tri(hydroxyethyl)ammonium hydroxide, tetra(hydroxyethyl)ammonium hydroxide, and benzyl trimethylammonium hydroxide.

Acids can also be optionally employed for pH adjustment in compositions of the invention. The acids used can be of any suitable type, including, by way of example, formic acid, acetic acid, propanoic acid, butanoic acid, pentanoic acid, isovaleric acid, hexanoic acid, heptanoic acid, octanoic acid, nonanoic acid, lactic acid, hydrochloric acid, nitric acid, phosphoric acid, sulfuric acid, hydrofluoric acid, malic acid, fumaric acid, malonic acid, glutaric acid, glycolic acid, salicylic acid, 1,2,3-benzenetricarboxylic acid, tartaric acid, gluconic acid, citric acid, phthalic acid, pyrocatechoic acid, pyrogallol carboxylic acid, gallic acid, tannic acid, and mixtures including two or more acids of the foregoing or other types.

Amines when present can be of any suitable type, including, by way of example, hydroxylamine, monoethanolamine, diethanolamine, triethanolamine, diethyleneglycolamine, N-hydroxylethylpiperazine, N-methylethanolamine, N,N-dimethylethanolamine, N-ethylethanolamine, N,N-diethylethanolamine, propanolamine, N,N-dimethylpropanolamine, N-ethylpropanolamine, N,N-diethylpropanolamine, 4-(2-hydroxyethyl)morpholine, aminoethylpiperazine, and mixtures including two or more of the foregoing or other amine species.

Surfactants when optionally employed in compositions of the invention can be of any suitable type, including nonionic, anionic, cationic, and amphoteric surfactants, and polyelectrolytes including, for example: salts of organic acids; alkane sulfates (e.g., sodium dodecyl sulfate); alkane sulfonates; substituted amine salts (e.g., cetylpyridium bromide); betaines; polyethylene oxide; polyvinyl alcohol; polyvinyl acetate; polyacrylic acid; polyvinyl pyrrolidone; polyethyleneimine; and esters of anhydrosorbitols, such as those commercially available under the trademarks Tween® and Span®, as well as mixtures including two or more of the foregoing or other surfactant species.

The pH of CMP compositions of the invention can be at any suitable value that is efficacious for the specific polishing operation employed. In one embodiment, the pH of the CMP composition can be in a range of from about 2 to about 11, more preferably in a range of from about 2 to about 7.0, and most preferably in a range of from about 3 to about 6.

The solvents employed in CMP compositions of the invention can be single component solvents or multicomponent solvents, depending on the specific application. In one embodiment of the invention, the solvent in the CMP composition is water. In another embodiment, the solvent comprises an organic solvent, e.g., methanol, ethanol, propanol, butanol, ethylene glycol, propylene glycol, glycerin, etc. In yet another embodiment, the solvent comprises a water-alcohol solution. A wide variety of solvent types and specific solvent media can be employed in the general practice of the invention to provide a solvating/suspending medium in which the abrasive is dispersed and in which the other components are incorporated to provide a composition of appropriate character, e.g., of slurry form, for application to the platen of the CMP unit to provide a desired level of polishing of the copper on the wafer substrate.

In one embodiment, the invention provides a CMP composition useful for chemical mechanical polishing of substrates having copper thereon, e.g., copper interconnects, metallization, device structural elements, etc., in which the composition includes hydrogen peroxide, glycine, ATA, abrasive and solvent.

In another embodiment, the CMP composition of the invention is an aqueous slurry composition, and includes an aqueous medium, abrasive, ATA, $H_2O_2$ and glycine, wherein ATA, $H_2O_2$ and glycine have the following composition by weight, based on the total weight of the composition:

| ATA | 0.01–10 wt. % |
|---|---|
| $H_2O_2$ | 1–30 wt. % |
| Glycine | 0.1–25 wt. %. |

In a further specific illustrative embodiment, the CMP composition comprises the following components by weight, based on the total weight of the composition:

| ATA | 0.01–10 wt. % |
|---|---|
| $H_2O_2$ | 1–30 wt. % |
| Glycine | 0.1–25 wt. %. |
| Abrasive | 0–30 wt. % |
| Water | 30–90 wt. % | with the total wt. % of all components in the composition totaling to 100 wt. %.

The CMP compositions of the invention can be readily formulated in a so-called 'day tank' or 'storage tank,' or the CMP composition can be provided as a two-part formulation or a multi-part formulation that is mixed at the point of use. The advantage of a multi-part formulation resides in its extended shelf life, relative to single-package formulations. A single package formulation is more susceptible to decomposition and change of its properties over time, in relation to a multi-part formulation, due to the presence of the oxidizer in the single-package CMP composition. The individual parts of the multi-part formulation can be mixed at the polishing table, polishing belt or the like, or in an appropriate container shortly before reaching the polishing table.

In one embodiment, each single ingredient of the CMP composition is individually delivered to the polishing table for combination at the table with the other ingredients of the formulation, to constitute the CMP composition for use. In another embodiment, the CMP composition is formulated as a two-part composition in which the first part comprises abrasive and corrosion inhibitor in aqueous medium, and the second part comprises oxidizing agent and chelating agent. In still another embodiment, the CMP composition is formulated as a two-part composition in which the first part comprises all components of the composition except the oxidizer, and the second part comprises the oxidizer. In all of these various embodiments, the mixing of ingredients or parts to form the final composition occurs at the point of use, with mixing at the polishing table, polishing belt or the like, or in an appropriate container shortly before reaching the polishing table.

The copper CMP composition of the invention can be utilized in a conventional manner in the CMP operation, by application of the CMP composition to the copper surface on the wafer substrate in a conventional fashion, and polishing of the copper surface can be carried out using a conventional polishing element such as a polishing pad, polishing belt, or the like.

The CMP composition of the invention is advantageously employed to polish surfaces of copper elements on semiconductor substrates, without the occurrence of dishing or other adverse planarization deficiencies in the polished copper, even when significant amounts of copper ions, e.g., $Cu^{2+}$ ions, are present in the bulk CMP slurry composition and/or at the copper/CMP slurry interface during CMP processing.

CMP slurry compositions of the invention are highly effective for polishing copper on semiconductor wafer substrates, e.g., polishing of patterned copper wafers. The CMP compositions of the invention can be readily prepared by mixing of ingredients in the desired single-package or multi-part formulations, consistent with the foregoing discussion herein of single-package and multi-part formulations. The concentrations of the respective ingredients can be widely varied in specific formulations of the CMP composition, in the practice of the invention, and it will be appreciated that the CMP composition of the invention can variously and alternatively comprise, consist or consist essentially of any combination of ingredients consistent with the disclosure herein.

The features and advantages of the invention are more fully shown by the empirical examples and results discussed below.

EXAMPLE 1

In a comparative test of CMP slurry compositions, Cu corrosion rates were determined by electrochemical methods and are shown in FIG. 1 as a function of $Cu^{2+}$ concentration, with various corrosion inhibitors being tested. More specifically, FIG. 1 is a graph of static etch rates of Cu metal, in Angstroms per minute, as a function of added copper sulfate ($CuSO_4.5H_2O$) concentration, in a $H_2O_2$/Glycine/$Cu^{2+}$ system at pH 3.5, with respective formulations incorporating the following ingredients: formulation (i)—5% $H_2O_2$ and 1% glycine, formulation (ii)—5% $H_2O_2$, 1% glycine, and 0.15% BTA, formulation (iii)—5% $H_2O_2$, 1% glycine, and 0.15% 5-aminotetrazole monohydrate, and formulation (iv)—5% $H_2O_2$, 1% glycine, and 0.15% 1-hydroxybenzotriazole.

The results shown in FIG. 1 reveal significant increase in corrosion rate with increasing concentration of $Cu^{2+}$ as copper sulfate pentahydrate ($CuSO_4.5H_2O$) is added to the formulations (i), (ii) and (iv). By contrast, the passivation effect of ATA in composition (iii) is almost independent of the $Cu^{2+}$ concentration change, compared to the formulations containing BTA and hydroxy-BTA. ATA thus provides an unexpected substantial improvement over BTA in the copper CMP slurry composition, and the results evidence the utility of ATA as a corrosion inhibitor that enables stable, consistent polishing of the copper on the microelectronic substrate to be achieved.

EXAMPLE 2

The corrosion potentials of ATA-containing solutions were measured, and determined to be constant within a range of from 0.28 to 0.35 volts when measured against a Ag/AgCl-in-saturated-KCl reference electrode. These results show that copper is thermodynamically more stable in $H_2O_2$/glycine/ATA compositions than in $H_2O_2$/glycine compositions, since in the latter composition lacking ATA, the corrosion potential of copper was 0.17 volts when measured against a Ag/AgCl-in-saturated-KCl reference electrode.

EXAMPLE 3

To evaluate ATA inhibitor-containing CMP slurries of the invention, slurry compositions were prepared with differing ATA concentrations. A first part of the CMP formulation was delivered in slurry line 1, and a second part of the CMP formulation was delivered in slurry line 2. The respective parts then were mixed on the platen of the CMP device to produce the CMP composition.

The first part of the CMP formulation in slurry line 1 contained 2% Nanotek alumina (commercially available from Nanophase Technologies Corporation, Romeoville, Ill.) in an aqueous medium (deionized water) at a pH of 3.5. This first part of the CMP formulation was delivered to the platen at a flow rate of 125 milliliters per minute. The second part of the CMP formulation in line 2 contained 10% hydrogen peroxide, 2% glycine, and ATA, in deionized water as the solvent, at a pH of 3.5. The second part of the formulation was delivered to the platen at a flow rate of 125 milliliters per minute. The concentration of ATA in such second part of the formulation was twice the concentration of the ATA desired in the final slurry, since the final slurry was produced by mixing the streams from slurry line 1 and slurry line 2 on the platen.

The final CMP composition produced by mixing the streams from slurry lines 1 and 2 therefore had a final composition of 5% hydrogen peroxide, 1% glycine, 1% Nanotek alumina abrasive, and ATA, at a pH of 3.5.

Copper-coated silicon wafers, with the film stack comprising c-Si bulk/5,000 Angstroms TEOS $SiO_2$/250 Angstroms Ta liner/1,000 Angstroms PVD Cu seed/15,000 Angstroms ECD Cu, were polished using the respective slurry compositions of differing concentrations of ATA, and the removal rate of copper from the coated wafer using each of the respective slurry compositions was measured utilizing a 4-point probe. The results are shown in FIG. 2.

Figure 2:
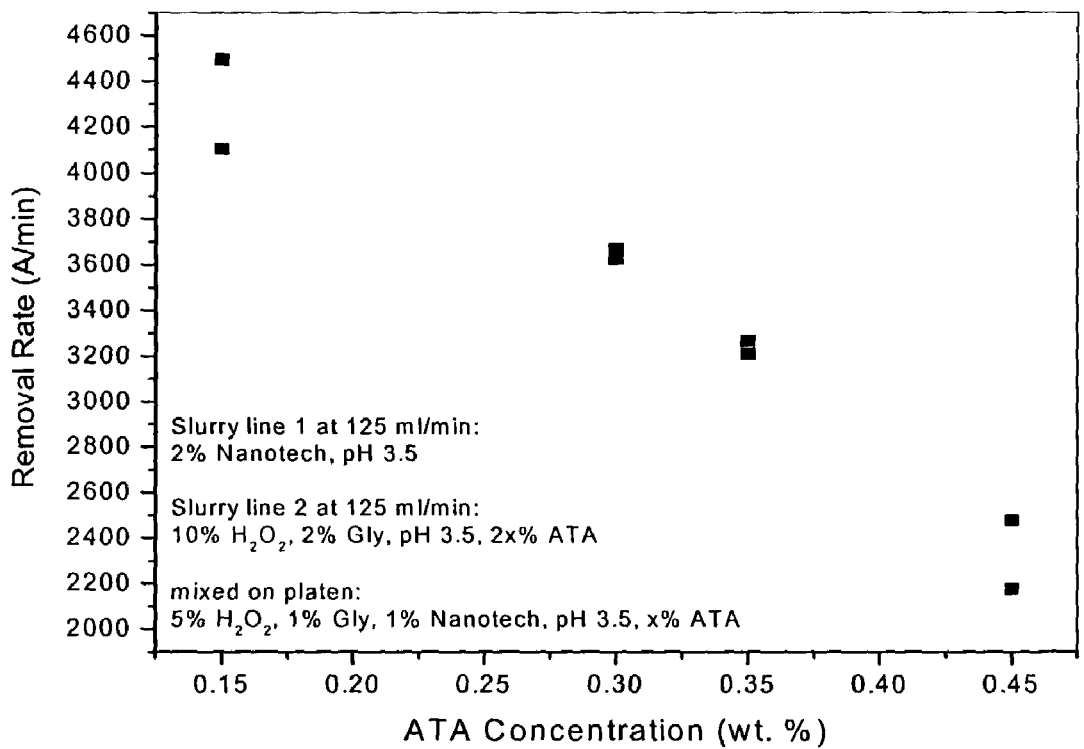
FIG. 2 is a graph of removal rate of copper metal, in Angstroms per minute, as a function of ATA concentration in wt %, based on the total weight of the CMP slurry composition.

FIG. 2 is a graph of removal rate of copper metal, in Angstroms per minute, as a function of ATA concentration in wt %, based on the total weight of the slurry composition. The results show that the removal rates of copper in a range of about 2200 Angstroms per minute to about 4500 Angstroms per minute were achieved at ATA concentrations in a range of from 0.15 wt. % to 0.45 wt. %, with the rate of copper removal decreasing in a generally linear fashion over such ATA concentration range.

EXAMPLE 4

Dishing of 10 micron copper lines was studied, using a Strasbaugh 6EC polishing tool (commercially available from Strasbaugh Corporation, San Luis Obispo, Calif.). The polishing pad assembly included an IC 1000 polishing pad and a Suba IV subpad (commercially available from Rodel Corporation, Newark, Del.). Polishing conditions included a 4 psi downforce, table and carrier speed of 90 rpm, and a slurry flow rate of 250 ml/min. A Sematech (Austin, Tex.) 854 patterned wafer was used to investigate dishing of both isolated and array (50% pattern density) copper lines.

Two aqueous slurry copper CMP formulations were tested. Formulation 1 contained 0.2% BTA, 1% alumina abrasive, 5% hydrogen peroxide and 1% glycine, at a pH of 3.5. Formulation 2 contained 0.4% ATA, 2% glycine, 5% hydrogen peroxide and 1% alumina abrasive. The results showed a significant disparity between dishing in the isolated and array lines at endpoint (all Cu metal film was removed from the wafer) when BTA was used as the corrosion inhibitor (Formulation 1). When ATA replaced BTA as the corrosion inhibitor (Formulation 2), both the isolated and array 10 micron lines were dished to the same extent at endpoint of the CMP polishing operation, and the overall extent of dishing was substantially reduced.

While the invention has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Correspondingly, the invention as hereinafter claimed is intended to be broadly construed and interpreted, as including all such variations, modifications and alternative embodiments, within its spirit and scope.

What is claimed is:

1. A CMP composition, including 5-aminotetrazole (ATA) and a chelating agent, wherein the chelating agent comprises at least one amino acid selected from the group consisting of glycine, serine, proline, leucine, alanine, asparagine, aspartic acid, glutamine, valine, and lysine.

2. The CMP composition of claim 1, further including oxidizing agent.

3. The CMP composition of claim 2, wherein the oxidizing agent comprises at least one agent selected from the group consisting of ferric nitrate, ferric ammonium oxalate, ferric ammonium citrate, permanganate salts, peroxyacids, peroxoborate salts, urea-hydrogen peroxide, iodate salts, perchlorate salts, persulfate salts, bromate salts, benzoquinone, chlorate salts, chlorite salts, hypochlorite salts, hypoiodite salts, oxybromide salts, percarbonate salts, periodate salts, ceric salts, chromate and dichromate compounds, cupricyanide and ferricyanide salts, ferriphenanthroline, ferripyridine and ferrocinium.

4. The CMP composition of claim 3, wherein the oxidizing agent comprises at least one agent selected from the group consisting of potassium permanganate, peracetic acid, potassium peroxoborate, potassium iodate, tetramethylammonium perchlorate, and ammonium ceric sulfate.

5. The CMP composition of claim 2, wherein the oxidizing agent comprises at least one agent selected from the group consisting of peracetic acid, urea-hydrogen peroxide, di-t-butyl peroxide, benzyl peroxide, and hydrogen peroxide.

6. The CMP composition of claim 2, wherein the oxidizing agent comprises at least one agent selected from the group consisting of ferric nitrate and hydrogen peroxide.

7. The CMP composition of claim 2, wherein the oxidizing agent comprises hydrogen peroxide.

8. The CMP composition of claim 1, further including another chelating agent in combination with the at least one amino acid.

9. The CMP composition of claim 8, wherein said another chelating agent comprises at least one agent selected from the group consisting of polyamine complexes and their salts, and polycarboxylic acids.

10. The CMP composition of claim 9, wherein the chelating agent comprises at least one agent selected from the group consisting of ethylenediaminetetraacetic acid, N-hydroxyethylethylenediaminetriacetic acid, nitrilotriacetic acid, diethylenetriaminepentaacetic acid, ethanoldiglycinate, phthalic acid, oxalic acid, malic acid, succinic acid, mandelic acid, and mellitic acid.

11. The CMP composition of claim 1, wherein the chelating agent comprises glycine.

12. The CMP composition of claim 1, wherein the composition does not contain benzotriazole.

13. The CMP composition of claim 1, wherein ATA has a concentration of from about 0.01 to about 10% by weight, based on total weight of the CMP composition.

14. The CMP composition of claim 1, wherein ATA has a concentration of from about 0.05 to about 5% by weight, based on total weight of the CMP composition.

15. The CMP composition of claim 1, wherein ATA has a concentration of from about 0.1 to about 1.0% by weight, based on total weight of the CMP composition.

16. The CMP composition of claim 1, wherein ATA has a concentration of from about 0.2 to about 0.8% by weight, based on total weight of the CMP composition.

17. The CMP composition of claim 1, further comprising another corrosion inhibitor in combination with ATA.

18. The CMP composition of claim 17, wherein said another corrosion inhibitor comprises at least one inhibitor selected from the group consisting of imidazole, benzotriazole, benzimidazole, amino, imino, carboxy, mercapto, nitro, alkyl, urea and thiourea compounds and derivatives.

19. The CMP composition of claim 17, wherein said another corrosion inhibitor comprises at least one inhibitor selected from the group consisting of tetrazoles other than ATA, and their derivatives.

20. The CMP composition of claim 1, further comprising abrasive.

21. The CMP composition of claim 20, wherein the abrasive comprises at least one abrasive selected from the group consisting of metal oxides, silicon nitrides, and carbides.

22. The CMP composition of claim 20, wherein the abrasive comprises at least one abrasive selected from the group consisting of silica, alumina, silicon carbide, silicon nitride, iron oxide, ceria, zirconium oxide, tin oxide, titanium dioxide, and alumina-coated colloidal silica.

23. The CMP composition of claim 20, wherein the abrasive is in divided form.

24. The CMP composition of claim 23, wherein the abrasive is in particulate form.

25. The CMP composition of claim 20, wherein the abrasive comprises alumina.

26. The CMP composition of claim 25, wherein the alumina includes at least one form selected from the group consisting of boehmite and transitional $\delta$, $\theta$ and $\gamma$ phase alumina forms.

27. The CMP composition of claim 20, wherein the abrasive comprises composite particles formed of at least two materials.

28. The CMP composition of claim 20, wherein the abrasive comprises organic polymer particles.

29. The CMP composition of claim 28, wherein the organic polymer particles are formed of at least one material selected from the group consisting of thermoset resins and thermoplastic resins.

30. The CMP composition of claim 28, wherein the organic polymer particles comprise particles formed of at least two different materials.

31. The CMP composition of claim 20, wherein the abrasive comprises particles including both inorganic and organic components.

32. The CMP composition of claim 20, wherein the abrasive comprises particles formed of at least one resin selected from the group consisting of epoxies, urethanes, polyesters, polyamides, polycarbonates, polyolefins, polyvinylchloride, polystyrenes, polyolefins, and (meth)acrylic resins.

33. The CMP composition of claim 1, further comprising a pH adjustment agent.

34. The CMP composition of claim 33, wherein the pH adjustment agent comprises at least one acid.

35. The CMP composition of claim 34, wherein the at least one acid comprises at least one acid selected from the group consisting of formic acid, acetic acid, propanoic acid, butanoic acid, pentanoic acid, isovaleric acid, hexanoic acid, heptanoic acid, Octanoic acid, nonanoic acid, lactic acid, hydrochloric acid, nitric acid, phosphoric acid, sulfuric acid, hydrofluoric acid, malic acid, fumaric acid, malonic acid, glutaric acid, glycolic acid, salicylic acid, 1,2,3-benzenetricarboxylic acid, tartaric acid, gluconic acid, citric acid, phthalic acid, pyrocatechoic acid, pyrogallol carboxylic acid, gallic acid, and tannic acid.

36. The CMP composition of claim 33, wherein the pH adjustment agent comprises at least one base.

37. The CMP composition of claim 36, wherein the at least one base comprises at least one base selected from the group consisting of potassium hydroxide, ammonium hydroxide, tetramethylammoniumhydroxide, tetraethylammonium hydroxide, trimethyl hydroxyethylammonium hydroxide, methyl tri (hydroxyethyl) ammonium hydroxide, tetra(hydroxyethyl)ammonium hydroxide, and benzyl trimethylammonium hydroxide.

38. The CMP composition of claim 1, further comprising at least one amine.

39. The CMP composition of claim 38, wherein said at least one amine comprises at least one amine selected from the group consisting of hydroxylamine, monoethanolamine, diethanolamine, triethanolamine, diethyleneglycolamine, N-hydroxylethylpiperazine, N-methylethanolamine, N,N-dimethylethanolamine, N-ethylethanolamine, N,N-diethylethanolamine, propanolamine, N,N-dimethylpropanolamine, N-ethylpropanolamine, N,N-diethylpropanolamine, 4-(2-hydroxyethyl)morpholine, and aminoethylpiperazine.

40. The CMP composition of claim 1, further comprising at least one surfactant.

41. The CMP composition of claim 40, wherein said at least one surfactant comprises at least one surfactant selected from the group consisting of non-ionic surfactants, anionic surfactants, cationic surfactants, amphoteric surfactants, and polyelectrolytes.

42. The CMP composition of claim 40, wherein said at least one surfactant comprises at least one surfactant selected from the group consisting of: salts of organic acids; alkane sulfates; alkane sulfonates; substituted amine salts; betaines; polyethylene oxide; polyvinyl alcohol; polyvinyl acetate; polyacrylic acid; polyvinyl pyrrolidone; polyethyleneimine; and esters of anhydrosorbitols.

43. The CMP composition of claim 40, wherein said at least one surfactant comprises at least one surfactant selected from the group consisting of: sodium dodecyl sulfate and cetylpyridium bromide.

44. The CMP composition of claim 1, having a pH in a range of from about 2 to about 11.

45. The CMP composition of claim 1, having a pH in a range of from about 2 to about 7.0.

46. The CMP composition of claim 1, having a pH in a range of from about 3 to about 6.

47. The CMP composition of claim 1, further comprising solvent.

48. The CMP composition of claim 47, wherein the solvent comprises a single component Solvent.

49. The CMP composition of claim 47, wherein the solvent comprises a multicomponent solvent.

50. The CMP composition of claim 47, wherein the solvent comprises at least one organic solvent.

51. The CMP composition of claim 50, wherein the at least one organic solvent comprises at least one solvent selected from the group consisting of methanol, ethanol, propanol, butanol, ethylene glycol, propylene glycol, and glycerin.

52. The CMP composition of claim 50, wherein the at least one organic solvent comprises at least one hydroxyl-containing solvent.

53. The CMP composition of claim 47, wherein the solvent comprises at least one alcohol.

54. The CMP composition of claim 47, wherein the solvent comprises at least one glycol solvent.

55. The CMP composition of claim 47, wherein the solvent comprises water.

56. The CMP composition of claim 47, wherein the solvent comprises water and alcohol.

57. The CMP composition of claim 1, further comprising an oxidation inhibitor including at least one inhibitor selected from the group consisting of carboxylic acids and azole compounds other than ATA and benzotriazole.

58. A CMP composition, comprising abrasive, solvent, 5-aminotetrazole (ATA), $H_2O_2$ and glycine, wherein ATA, $H_2O_2$ and glycine have the following concentrations by weight, based on total weight of the composition:

| | |
|---|---|
| ATA | 0.01–10 wt. % |
| $H_2O_2$ | 1–30 wt. % |
| Glycine | 0.1–25 wt. %. |

59. A CMP composition comprising the following components by weight, based on total weight of the composition:

| | |
|---|---|
| 5 aminotetrazole (ATA) | 0.01–10 wt. % |
| H$_2$O$_2$ | 1–30 wt. % |
| Glycine | 0.1–25 wt. % |
| Abrasive | 0–30 wt. % |
| Water | 30–90 wt. % | with total wt. % of all components in the composition totaling to 100 wt. %.

60. The CMP composition of claim 59, wherein said abrasive comprises silica.

61. The CMP composition of claim 1, comprising a two-part formulation including a first part comprising abrasive and ATA in an aqueous medium, and a second part comprising oxidizing agent and chelating agent.

62. The CMP composition of claim 1, comprising a two-part formulation including a first part comprising abrasive, chelating agent and ATA in an aqueous medium, and a second part comprising oxidizing agent.

63. The CMP composition of claim 1, comprising abrasive, ATA, solvent, oxidizing agent and chelating agent, in a single package formulation.

64. A method of polishing copper on a substrate having copper thereon, including contacting copper on the substrate under CMP conditions with a CMP composition effective for polishing the copper, wherein the CMP composition includes 5-aminotetrazole (ATA) and a chelating agent, wherein the chelating agent comprises at least one amino acid selected from the group consisting of glycine, serine, proline, leucine, alanine, asparagine, aspartic acid, glutamine, valine, and lysine.

65. The method of claim 64, wherein said CMP conditions comprise use of a polishing element on said copper contacted with said CMP composition, wherein said polishing element includes at least one element selected from the group consisting of polishing pads and polishing belts.

66. The method of claim 64, wherein said CMP composition further comprises abrasive, oxidizing agent, another chelating agent in combination with the at least one amino acid and solvent.

67. The method of claim 64, wherein said CMP composition further comprises hydrogen peroxide, glycine, abrasive and water.

68. The method of claim 64, wherein said copper is on a semiconductor substrate and forms a constituent element of a microelectronic device.

69. The method of claim 68, wherein said constituent element is selected from the group consisting of interconnects, contacts, conductive vias, metallization, electrodes, and conductive base layers for field emitter components.

70. The method of claim 64, wherein said CMP composition comprises abrasive, solvent, ATA, H$_2$O$_2$ and glycine, wherein ATA, H$_2$O$_2$ and glycine have the following concentrations by weight, based on total weight of the composition:

| | |
|---|---|
| ATA | 0.01–10 wt. % |
| H$_2$O$_2$ | 1–30 wt. % |
| Glycine | 0.1–25 wt. % |
| Abrasive | 0–30 wt. % |
| Water | 30–90 wt. %. |

71. The method of claim 64, wherein said CMP composition comprises the following components by weight, based on the total weight of the composition:

| | |
|---|---|
| ATA | 0.01–10 wt. % |
| H$_2$O$_2$ | 1–30 wt. % |
| Glycine | 0.1–25 wt. % |
| Abrasive | 0–30 wt. % |
| Water | 30–90 wt. % | with total wt. % of all components in the composition totaling to 100 wt. %.

72. The method of claim 64, wherein said contacting is conducted on a polishing table.

73. The method of claim 64, wherein said contacting is conducted with a polishing belt contacting the surface.

74. The method of claim 64, wherein the CMP composition comprises a two-part formulation including a first part comprising abrasive and ATA in an aqueous medium, and a second part comprising oxidizing agent and chelating agent, said method further comprising mixing the first part and the second part to produce said CMP composition.

75. The method of claim 64, wherein the CMP composition comprises a two-part formulation including a first part comprising abrasive, chelating agent and ATA in an aqueous medium, and a second part comprising oxidizing agent, said method further comprising mixing the first part and the second part to produce said CMP composition.

76. The method of claim 64, wherein the CMP composition comprises abrasive, ATA, solvent, oxidizing agent and chelating agent, in a single package formulation.

77. A method of manufacturing a semiconductor device, said method comprising contacting a substrate with the composition of claim 1.

78. A method of manufacturing a semiconductor device, said method comprising contacting a substrate with the composition of claim 1, wherein the composition further comprises at least one oxidizing agent and abrasive.

79. The method of claim 78, wherein the composition comprises a two-part formulation including a first part comprising abrasive, chelating agent and ATA in an aqueous medium, and a second part comprising oxidizing agent, said method further comprising mixing the first part and the second part to produce said composition.

* * * * *